United States Patent [19]

Pace

[11] Patent Number: 5,627,406

[45] Date of Patent: May 6, 1997

[54] INVERTED CHIP BONDED MODULE WITH HIGH PACKAGING EFFICIENCY

[76] Inventor: Benedict G. Pace, 2200 Smithtown Ave., Ronkonkoma, N.Y. 11779

[21] Appl. No.: 689,388

[22] Filed: Aug. 12, 1996

Related U.S. Application Data

[63] Continuation of Ser. No. 361,931, Dec. 22, 1994, abandoned.

[51] Int. Cl.$^6$ .......................... H01L 23/48; H01L 23/04; H01L 23/053; H01L 23/06
[52] U.S. Cl. .......................... 257/700; 257/690; 257/698; 257/703
[58] Field of Search .................................. 257/347, 700, 257/698, 74, 690, 703

[56] References Cited

U.S. PATENT DOCUMENTS

| | | | |
|---|---|---|---|
| 4,614,194 | 9/1986 | Jones et al. | 128/419 |
| 5,111,278 | 5/1992 | Eichelberger | 257/698 |
| 5,166,773 | 11/1992 | Temple et al. | 257/700 |
| 5,216,278 | 6/1993 | Lin et al. | 257/688 |
| 5,265,321 | 11/1993 | Nelson et al. | 29/841 |

FOREIGN PATENT DOCUMENTS

| | | | |
|---|---|---|---|
| 0165575 | 12/1985 | European Pat. Off. | H01L 23/52 |
| 0525497 | 7/1992 | European Pat. Off. | H05K 3/00 |
| 3909244 | 9/1990 | Germany | H05K 3/46 |
| 4129964 | 3/1993 | Germany | H05K 13/04 |
| 2225670 | 6/1990 | United Kingdom | H01L 23/12 |
| 9418707 | 8/1994 | WIPO | H01L 31/00 |

OTHER PUBLICATIONS

Yamamoto, Sugimoto, Miyake & Blankenhorn, *Evaluation of New Micro-Connection System Using Microbumps*, Microcircuits & Electronic Packaging, 15, 259–271 (1994).
Matthew, Kovac, Martinez & DiStefano, *Area Array Packaging*, Advanced Packaging, Jul./Aug. 91–94 (1994).
DeHaven & Dietz, Proc. 1994 IEEE 44th Electronic Comp. & Tech. Conf., IEEE, Piscataway, NJ (1994).
R. Tummula & E. Rymaszewski, *Microelectronics, Packaging Handbook* 363–380 (1989).
Balderes et al., "Heat Dissipation from IC Chips Through Module Package" *IBM Technical Disclosure Bulletin* v 19, No. 11, pp. 4165–4166 (Apr. 1977).

Primary Examiner—Jerome Jackson, Jr.
Assistant Examiner—Valencia Martin Wallace
Attorney, Agent, or Firm—John F. McCormack

[57] ABSTRACT

An electronic packaging module for inverted bonding of semiconductor devices, integrated circuits, and/or application specific integrated circuits is produced with protuberances on the conductive pattern of the substrate. The protuberances are of a soft, ductile metal capable of being metallurgically bonded to the input/output pads of semiconductor devices. The input/output pads of the semiconductor devices are simultaneously bonded to the protuberances of the packaging module.

26 Claims, 4 Drawing Sheets

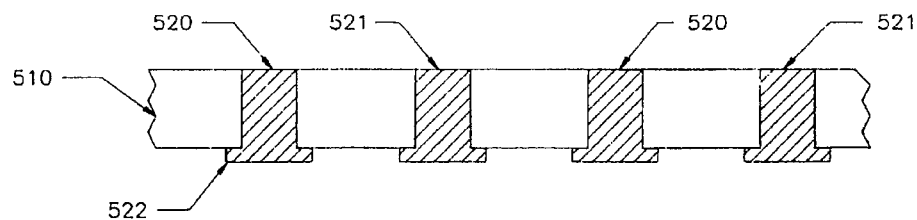
Fig. 5a
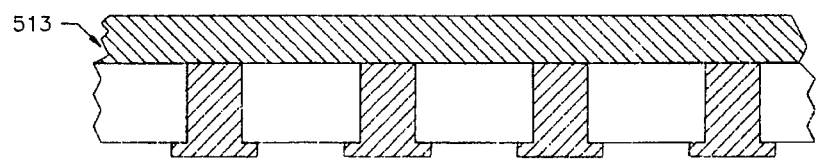
Fig. 5b
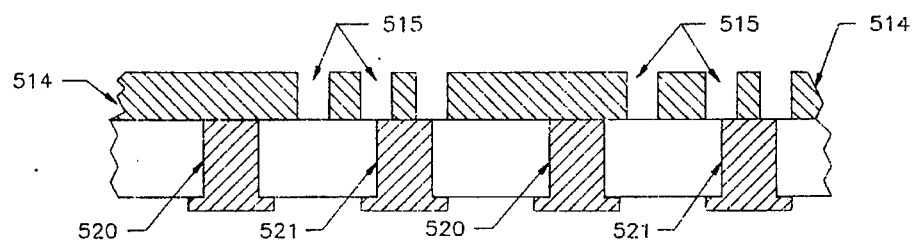
Fig. 5c
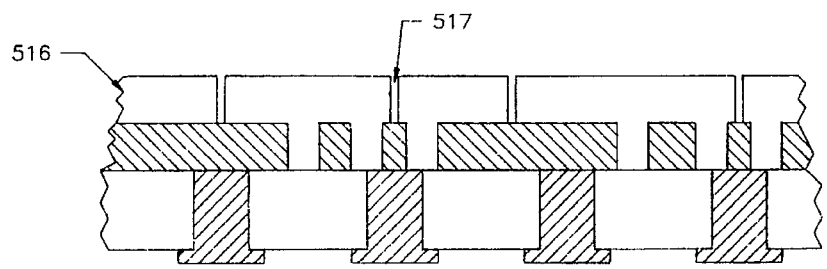
Fig. 5d
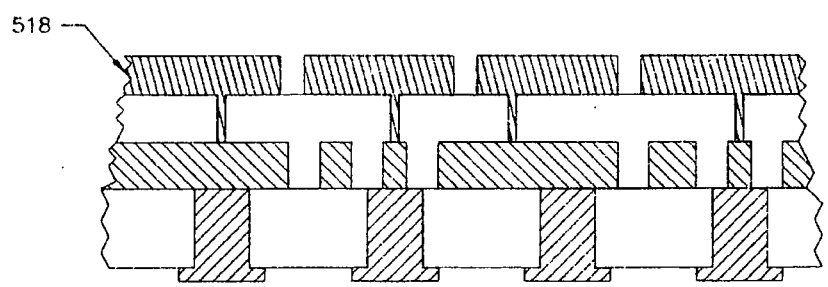
Fig. 5e
Fig. 5

INVERTED CHIP BONDED MODULE WITH HIGH PACKAGING EFFICIENCY

This is a continuation of application Ser. No. 08/361,931, filed Dec. 22, 1994, now abandoned.

FIELD OF THE INVENTION

This invention is related to the fields of ceramic chip carriers, hybrid circuits and multichip modules for electronic interconnections.

BACKGROUND OF THE INVENTION

The steady increase in the complexity and clock rate of integrated circuits requires shorter interconnection paths and closer packing of integrated circuit chips. The close packing of integrated circuits is measured by the packaging efficiency, the area required for a single integrated circuit chip and its interconnections.

Flip chip or C4 (Controlled Collapse Chip Connection) has about 90% packaging efficiency for a 10 mm×10 mm die. Wire bonding and TAB (Tape Automated Bonding) have packaging efficiencies of about 75% and 50%, respectively, for the same size die.

The C4 process has high packaging efficiency because the connections from the chip to the first level package are underneath the chip, and the connections from the first level package to the second level package are in an area array also underneath the chip. Wire bond and TAB interconnections to the first level package fan out from the periphery of the chip decreasing the packaging efficiency.

The C4 process has been used by only a few large volume manufacturers because it requires specially designed integrated circuits. The contacts of integrated circuits for the C4 process are in a grid over the surface of the chip, not on the perimeter as in the usual integrated circuit. Also the chips must be specially prepared for the user by the integrated circuit manufacturer with a thin layer of chromium and 0.1 mm (4 mil) high bumps of 97 Pb/3 Sn solder over the contacts.

Thick film hybrids have seen limited use as packages for the C4 process. Conventional, thick film, hybrid circuits are produced by screen printing. Minimum conductor widths are 125 µm (0.005"), minimum spacing between the conductors is 125 µm and the vias or openings between conductive pattern layers are typically 300 µm (0.012"). The theoretical line density or connectivity of thick film, hybrid circuits is 30 cm/cm$^2$ (75 in/in$^2$. The actual connectivity is 50% of the theoretical or 15 cm/cm$^2$. That means too many conductor layers are needed when interconnecting high pin count devices, and so conventional hybrid circuits can not readily provide high packaging efficiency.

Miniature flexible circuits have been designed to provide packaging efficiencies similar to the C4 process. The flexible circuits can be used with conventional integrated circuits having perimeter contacts. Gold conductors of the flexible circuit are thermosonically bonded the integrated circuits contacts. The conductors of the flexible circuit don't fan out from the integrated circuit contacts into the area around the chip, instead the conductors fan in underneath the chip terminating in a grid array of metal bumps underneath the chip for interconnection to second level packaging. The flexible circuit is bonded to the chip with an elastomeric adhesive 0.15 mm (6 mil) thick. The elastomeric adhesive and the flexible circuit materials limit the temperature range in manufacture and use, make the electrical properties sensitive to moisture, and prevent its use in hermetically sealed packages.

For new designs, the yield of good integrated circuits from a wafer is in the range of 10–35%. To increase the percentage of good integrated circuits in a batch, the circuits are tested in wafer form before cutting the dice out of the wafer. The power supply currents (DC testing) may be tested or the wafers may be boundary scan tested according to IEEE Standard 1149.1. Boundary scan testing of a wafer determines whether the gates of an individual circuit are functional, but it does not determine if the gates switch at the required speed, and does not check the integrity of the connections to the input/output pads (IOs) of the circuit. About 10% of the dice which pass the boundary scan test at the wafer level fail when mounted in a first level package and tested at speed and for functional parameters. In any multichip module (MCM) that contains several chips, the yield of good circuits from final assembly drops dramatically with die reliability. Even if the dice had been boundary scan tested in wafer form (90% good dice) only 35% of MCMs containing eight dice will be good after final assembly.

Testing the chips before final assembly to obtain known good die (KGD) greatly reduces the rework and the associated costs. Most dice are packaged, since the package enables testing to obtain KGD. However, the package takes up 2 to 10 times the area of the chip lowering the packaging efficiency and compromising the circuit performance. Although some temporary packages have been proposed for testing bare dice to obtain KGD, they have not yet found wide acceptance.

SUMMARY OF THE INVENTION

A first embodiment of the invention is a circuit module as a first level package for a semiconductor device. The module has a rigid, planar, insulating substrate that has a metallic, conductive pattern of one or more conductive pattern layers. The conductive pattern comprises thick or thin film metal layers. Each conductive pattern layer has an insulating layer over it. The conductive pattern layers are interconnected by metal filled vias in the insulating layers. The substrate has metal contacts that are connected to the conductive pattern, and are capable of making electrical connection to another electronic package or a higher level of electronic packaging. This embodiment of the invention is characterized by an outermost conductive pattern layer, having metal protuberances thereon, the protuberances rising above the surface of the layer, and the protuberances being a soft, ductile metal capable of being metallurgically bonded to the input/output pads of a semiconductor device. The metal protuberances provide connections to input/output pads of a semiconductor device and from the device to the conductive pattern of the electronic packaging module and through the metal contacts to another module or the next level electronic package.

In another embodiment, the invention is an electronic packaging module or circuit module for semiconductor devices. The base of the module is a planar, insulating substrate. The substrate has a metallic, conductive pattern. The conductive pattern has one or more conductive pattern layers. The conductive pattern layers are formed from either thick or thin film layers, or a combination of thick film layers and thin film layers. The substrate also has metal contacts connected to the conductive pattern, and capable of making electrical connection to another electronic package or a higher level of electronic packaging. The layers of the conductive pattern are separated by insulating layers, and the conductive pattern layers are interconnected by metal filled vias in the insulating layers. The outermost, conductive pattern layer has metal protuberances protruding above the surface of the layer. The protuberances are made of a soft, ductile metal capable of being metallurgically bonded to the input/output pads of an semiconductor device or integrated circuit chip, and are capable of providing input/output connections for semiconductor devices through the connections to the conductive pattern of the package or circuit and through the metal contacts to another electronic package or the next level electronic package.

In another embodiment, the invention is a module that employs as a base a ceramic or glass/ceramic substrate having a standard pattern of conductive feed-throughs. One side of the base is provided with contact pads, balls or pins connected to the feed-throughs, and the other side of the base is provided with a conductive pattern of one or more conductive pattern layers. Selected feed-throughs required by a custom module design are connected to the conductive pattern and feed-throughs not used in the custom module design are isolated by coating with an insulating layer. The conductive pattern is covered with an insulating layer of a dielectric composition. Laser ablation forms openings in the insulating layer covering the conductive pattern. The openings are made in a pattern corresponding to the input/output pads of one or more semiconductor devices or integrated circuit chips. Soft ductile metal is plated into the openings and forms protuberances above the fired layer. The semiconductor devices are metallurgically bonded to the protuberances, making connection through the protuberances to the conductive pattern and through the feed-throughs to the contact pads, balls or pins on the substrate.

In yet another embodiment, the electronic packaging module is a SCM, single chip module with high packaging efficiency. The high packaging efficiency arises since the SCM may be less than 6 mm (0.15 in.) wider than the bare integrated circuit die. The SCM is composed of a planar base with conductive feed-throughs in the base. On one side of the base the conductive feed-throughs are joined to a ball, column, land, or pin grid array. On the other side the feed-throughs are connected to a conductive pattern of thick and/or thin film metal layers. The conductive pattern layers are separated by insulating layers. The topmost, insulating layer has metal filled openings in it. The metal in the openings connects to underlying conductive pattern layer below, and ends above in soft, ductile metal protuberances protruding above the surface of the insulating layer. The protuberances are metallurgically bonded to the input/output pads of a semiconductor device or integrated circuit die. The semiconductor device is connected through the protuberances and the conductive pattern of the module and the feed-throughs of the substrate to a grid array of metal contacts underneath the die, and the area of the substrate having the grid array is inside the perimeter of the integrated circuit chip.

BRIEF DESCRIPTION OF THE DRAWINGS

FIGS. 5a–5h illustrates the steps in preparing a module according to this invention.

DETAILED DESCRIPTION OF THE INVENTION

Figure 1:
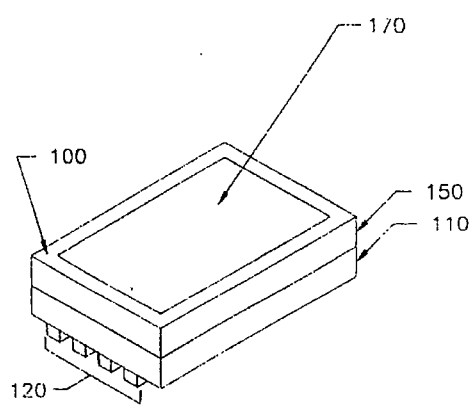
FIG. 1 is view of a SCM, single circuit module according to this invention.

This invention relates to first level electronic packaging for semiconductor devices, integrated circuits and application specific integrated circuits (ASICs).

The electronic packages have planar, insulating substrates. Ceramic substrates comprising aluminum oxide, aluminum nitride, beryllium oxide, boron nitride, cordierite, mullite, silicon carbide and silicon nitride are suitable. Especially suitable are substrates whose thermal expansion characteristics are closely matched to that of the semiconductor devices such as silicon, sapphire and glass/ceramics comprising aluminum oxide, aluminum nitride, beryllium oxide, boron nitride, cordierite, mullite, silicon carbide and silicon nitride.

The conductive patterns of the electronic packages may be prepared using the sputtered metal and high polymer dielectrics characteristic of the MCM-D (Multichip Module-Deposited) technique, but thick or thin film metallization, and fired, inorganic dielectrics are preferred.

An important feature of the invention is the formation of metal protuberances on the package joined to the conductive pattern and capable of being metallurgically bonded to the input/output pads of a semiconductor device (including integrated circuits and ASICs). The metal protuberances may be simultaneously bonded to the input/output pads of a semiconductor device, which is a simpler and faster process than the conventional, sequential wire bonding process.

The metal protuberances should be high enough above the surface of the electronic package to form a reliable metallurgical bond with the input/output pads of the semiconductor device. The protuberances should be greater than 5 µm high, and preferably greater than 10 µm. The protuberances must be high enough to compensate for the variations due to the camber, planarity and overall size of the both the electronic package and the device, and not so high that they collapse and short circuit in the bonding process. On 96% alumina substrates, protuberances as low as 25 µm are effective in bonding semiconductor devices with length and breadth up to 5 mm, and protuberances up to 80 µm are also effective. Smaller protuberances are effective on smoother substrates such as polished 99% alumina ceramics. Still smaller protuberances are effective for still smoother surfaces such as silicon wafers.

The input/output pads of such semiconductor devices are commonly metallized with aluminum or gold. The metal protuberances are capable of metallurgically bonding to the pads by thermocompression, thermosonic or ultrasonic means, or by soldering.

The metal of the metal protuberances is selected from the group comprising aluminum, gold, indium, lead, silver, tin and alloys of these metals.

Aluminum or gold protuberances are preferred when the metallization of the input/output pads of the semiconductor device is aluminum. Aluminum protuberances are formed by vacuum deposition of aluminum through a shadow mask. Gold protuberances are preferably formed by electrodeposition or electroless deposition. The metallurgical bonds between the gold protuberances and the pads can be formed by thermocompression, thermosonic or ultrasonic bonding. Gold protuberances are also suitable for when the metallization of the semiconductor input/output is gold. For thermocompression, thermosonic or ultrasonic bonding the metal protuberances should be soft, and ductile.

Indium metal protuberances are suitable for forming metallurgical bonds to gold metallization on the input/output pads. The metal protuberances also may be lead/indium or tin/indium alloys. The alloy metal protuberances are preferably overplated with a layer of pure indium. Indium and indium coated protuberances may be metallurgically bonded to the input/output pads of the semiconductor devices by an indium fusing or soldering process.

In one embodiment the invention, shown in FIG. 1, is a compact, ceramic, chip carrier or SCM, single chip module, 100 with high packaging efficiency. The SCM has a conductive pattern on a ceramic substrate 110 as a base. The base has area array contacts 120 for interconnection to second level packaging and a metal or ceramic frame 150 around the semiconductor device or integrated circuit chip. The area array of contacts may be an irregular array or a regular array such as a ball, pin, pad or column array. A metal or ceramic plug 170 is brazed to the frame to seal the module.

Figure 2:
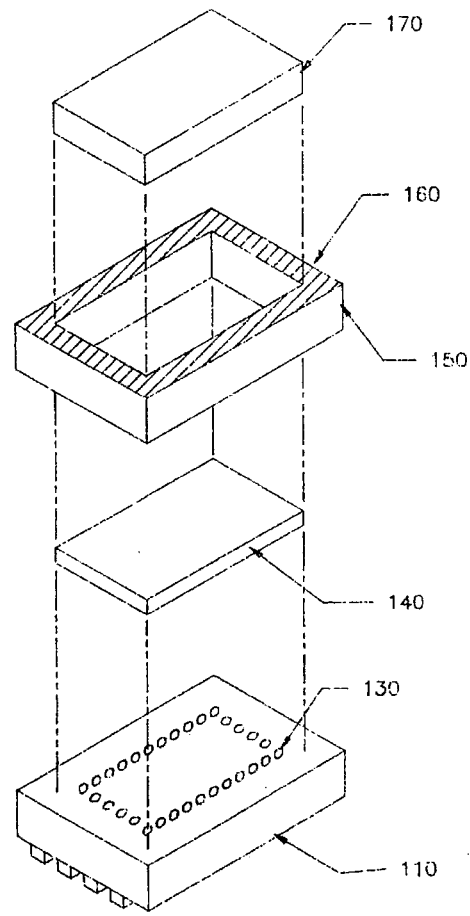
FIG. 2 is an exploded view of the SCM of FIG. 1.

In FIG. 2 the components of the module are shown. The hybrid circuit base 110 has protuberances 130 of a soft, ductile metal. The soft, ductile metal of the protuberances is capable of metallurgically bonding to the IOs, input/output contacts, of a semiconductor device or integrated circuit chip. A semiconductor device 140 is inverted for bonding so that the IOs face the protuberances on the hybrid circuit base. The IO contacts of the device are joined to the soft, ductile, metal protuberances of the hybrid circuit base by soldering or thermocompression, ultrasonic or thermosonic bonding. The IO contacts are then interconnected by the hybrid circuit conductive pattern to the area grid array.

The frame of the module 150 has a wall thickness of 0.4–1 mm (15–40 mils). The frame fits closely around the integrated circuit die, so that the overall module (FIG. 1, 100) is only 1.6–6 mm (40–150 mils) bigger than the die. For hermetically sealed modules, the frame is made of ceramic or metal. Ceramic frames are glass bonded to the base, and metal frames are brazed. A ceramic frame will preferably be metallized on its upper surface 160 for brazing to the metal plug.

The plug 170 is inside the frame preferably making contact with the back of the integrated circuit chip. When efficient removal of heat from the integrated circuit chip is required the plug is preferably made of metal or a heat conductive ceramic. Also, the plug preferably is made of an material that matches the thermal expansion of the base and the frame such as a copper/tungsten, nickel/cobalt/iron alloy or beryllia. The plug is soldered or bonded to the frame to seal the module.

When heat removal is not a serious problem, or the heat is removed through the module base, the frame may be closed with a cover that is not in contact with the chip.

When hermetic sealing is not required the integrated circuit may be sealed by molded plastic or a plastic enclosure adhesively bonded to the base, e.g., with an epoxy adhesive.

The embodiments shown in FIGS. 1, and 2 as SCMs (Single Chip Modules) provide a rugged package for full functional testing and/or burn-in of integrated circuits. After the testing and/or burn-in that provides known good die (KGD), the SCM can be mounted in a multichip package with packaging efficiency approaching or exceeding that of a wire-bonded chip.

When SCM packages are sealed or encapsulated in plastic, or hermetically sealed, the length and breadth of the base 110 of the SCM package may be as small as 1.6 mm (40 mils) greater than the length and breadth of the die. Preferably the base is smaller than 6 mm (150 mils) greater than the length and breadth of the die, and more preferably as small as 2.75 mm (70 mils) greater than the length and breadth of the die.

The highest packaging efficiency, and the smallest single chip package for testing and/or burn-in to obtain known good die (KGB), is achieved when the length and breadth of the base 110 are only 0.25 mm greater than, or even the same as, the length and breadth of the die. In this embodiment of the invention, the SCM is not encapsulated in plastic or hermetically sealed with the frame 150 and plug 170. The bond of the device to substrate can be further enhanced by a organic or inorganic adhesive means. The SCM comprises only the base 110 having a conductive pattern and conductive feed-throughs to grid array contacts, and the die 140 metallurgically bonded to metal protuberances 130. After testing and/or burn-in to verify a KGD, SCM may be subsequently mounted in a multichip module, and the whole multichip module sealed by encapsulating in plastic or in a hermetically sealed package.

Figures 3, 4:
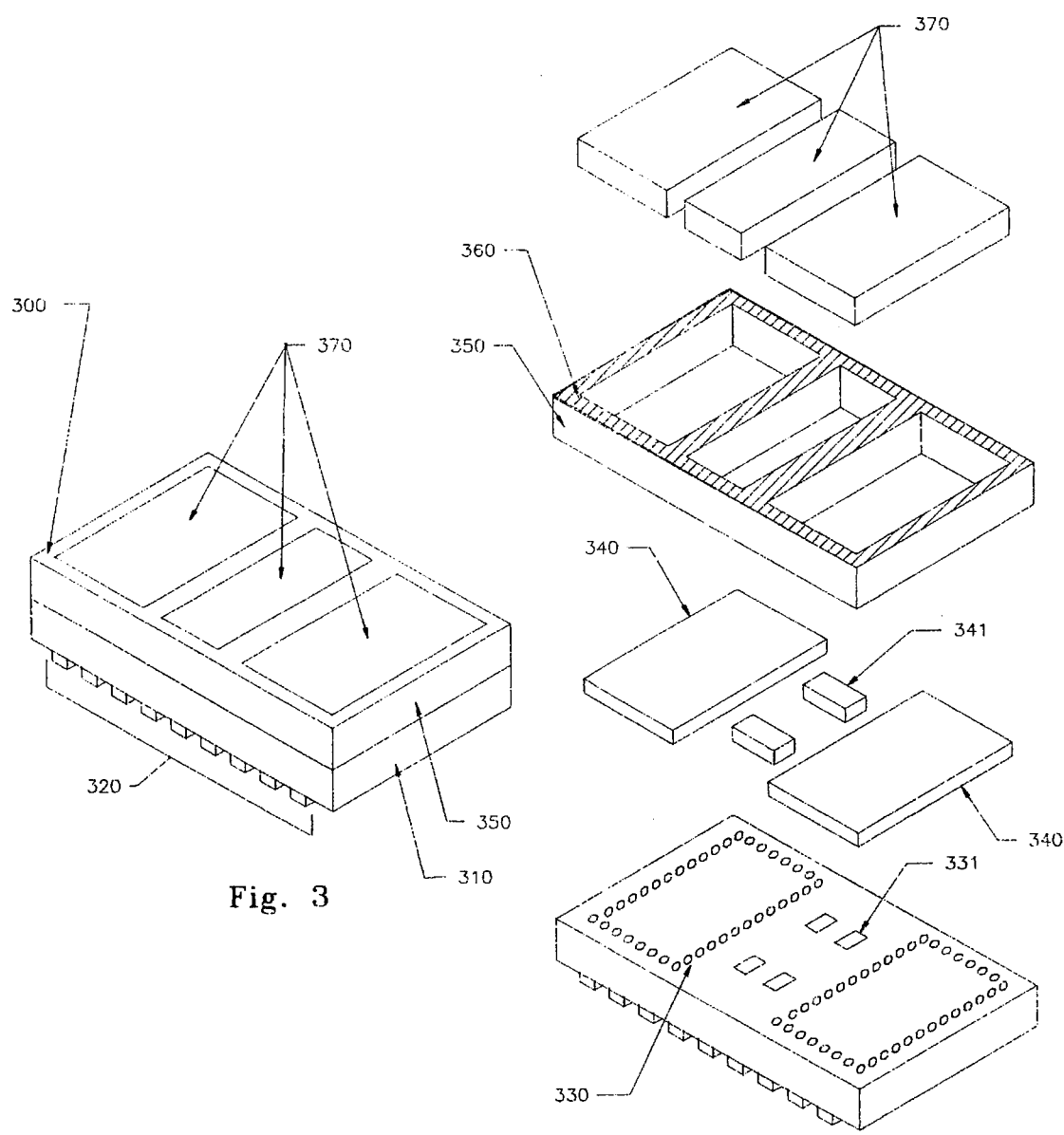
FIG. 3 is a view of a MCM, multichip module according to this invention.
FIG. 4 is and exploded view of the MCM of FIG. 3.

A MCM, multichip module, embodiment of the invention is shown in FIG. 3. The MCM 300 also has a high packaging efficiency. The MCM has a ceramic, hybrid circuit 310 as a base. The base has area array contacts 320 for interconnection to second level packaging and a metal or ceramic frame 350 around the integrated circuit chips and other components. Metal or ceramic plugs 370 are brazed to the frame to seal the module.

In FIG. 4 the components of the module are shown. The hybrid circuit base 310 has metallic pads 331 for bonding chip capacitors or other components. The hybrid circuit also has protuberances 330 of a soft, ductile metal. The soft, ductile metal of the protuberances is capable of metallurgically bonding to the IOs, input/output contacts, of a semiconductor device or integrated circuit chip. Semiconductor devices 340 and other components 341 are bonded in place. The devices and the other components are interconnected by the hybrid circuit conductive pattern, and connected by the hybrid circuit pattern to the area grid array.

The frame of the module 350 has a minimum wall thickness of 0.4 mm (15 mils). The frame fits closely around the integrated circuit dice and the other components, so that the overall module (FIG. 3, 300) has a high packaging efficiency. For hermetically sealed modules, the frame is made of ceramic or metal. A ceramic frame will preferably be metallized on its upper surface 360 for soldering to the metal plugs.

The plugs 370 fit inside the frame and contact the back of the integrated circuit chips in order to efficiently remove heat from the integrated circuit. The plugs are soldered or bonded to the frame to seal the module.

It will be obvious to those skilled in the art, that, since the chip is against the top of the package, heat sinks, heat exchangers or chill plates mounted on the top of the package will be a more efficient way to remove heat than in conventional "cavity up" packages where the heat has to be removed through the substrate into the next level package, e.g., a printed circuit board.

When heat removal is not a serious problem, or the heat is removed through the module base, the frame may be closed with a cover that is not in contact with the chip.

When hermetic sealing is not required the package may be sealed by molded plastic or a plastic enclosure adhesively bonded to the base, e.g., with an epoxy adhesive.

A disclosure of the steps of the process for manufacturing a single chip or multichip module is presented in FIGS. 5a–5h.

A planar substrate 510 provided with conductive feed-throughs 520, 521 and terminals 522 for connection to the next level of electronic packaging is illustrated in FIG. 5a. Any suitable electronic insulating material may be used for the substrate 510. Suitable material include silicon, sapphire and ceramics and glass/ceramics comprising alumina, mullite, cordierite, beryllia, aluminum nitride, boron nitride, silicon nitride, silicon carbide and silicon carbide with a small percentage of beryllia.

The feed-throughs 520 and 521 should have good conductivity and preferably maintain a hermetic seal. Refractive metal feed-throughs of tungsten or molybdenum prepared by the co-firing metal pastes in green ceramics provide hermetic feed-throughs.

The feed-throughs are usually arranged in a grid array, but they can be arranged in any convenient pattern. The pad pitch in the grid array may be 0.15–2.5 mm (6–100 mils) as required. A pad pitch between 0.25 and 0.5 mm (10–20 mils) is preferred for SCMs (single circuit modules); a 0.25–1.3 mm (10–50 mils) pad pitch is preferred for MCMs, and 1.3–2.5 mm (50–100 mils) pad pitch is preferred for pin grid arrays. Pins may be attached to the feed-throughs to provide a pin gird array.

A metal layer 513 is applied over the substrate as shown in FIG. 5b.

In one embodiment a layer of thick film metallic paste is applied over the surface of a ceramic substrate. The paste layer may cover the complete planar surface, or only a portion of the surface where metal conductors are required. The metallic paste may be selected from thick film conductor pastes containing copper, gold, platinum, palladium, silver or mixtures and alloys thereof. Copper and gold conductor pastes are preferred. One suitable gold contains 88% gold, 3–4% glass with 8–9% organic binder of ethyl cellulose and terpineol. A suitable copper paste is C7230™ Copper Conductor Paste commercially available from Heraeus Inc., Cermalloy Div., West Conshohocken, Pa. 19428.

The paste on the substrate is dried and fired to convert it to a metallic layer 513. A gold paste is fired in air and a copper paste is fired in a nitrogen atmosphere, both at 850° C. The metal layer is preferably 8–12 μm thick after firing.

Alternatively, the metal layer 513 may be deposited by a thin film technique. A suitable thin film metallization has a bonding layer of titanium/tungsten or chromium and 1–5 μm (40–200 microinches) of copper or gold.

FIG. 5c shows the production of a first conductive pattern layer 514 on the substrate 510. The first conductive pattern layer 514 is shown as an interdigitated voltage and ground plane. The conductive pattern is produced by the procedures of copending U.S. patent application Ser. No. 08/171,696, now U.S. Pat. No. 5,378,313, which is incorporated herein by reference.

An etch resistant image of the first conductive pattern layer is printed over the metal layer with a photoresist. Any photoresist, positive or negative acting, may be used provided it is not soluble in the etchant chosen, has good adhesion to the metal layer, and is capable of resolving 10 μm lines and spaces. One suitable photoresist is AZ 4210™ available from American Hoechst, Branchberg, N.J. The etch resist image leaves exposed a ring isolating each of the feed-throughs that should not be connected to the voltage/ground plane. The portion of the metal layer not covered by resist is etched away. A suitable etchant must remove all traces of the metal between the conductors without serious undercut the conductor edges. A suitable etchant for a gold layer is iodine in an aqueous solution of potassium iodide such as CGE-100™ from Micro Pac Co., Garland, Tex. Suitable copper etchants include sodium or ammonium peroxydisulfate solutions at 120–250 g/l, copper (II) chloride at 75–200 g/l, hydrogen peroxide 1–1.5 m/l in 1.5–3 molar sulfuric acid, 0.5–1.5 copper ammonium chloride at a pH of 8–9, and 30–48°Bé ferric chloride with 0.1 to 1.2 m/l hydrochloric acid. Copper etchants are used at temperatures between 15°–50° C. depending on the copper paste and etching solution used.

After etching the etch resist is stripped leaving the voltage/ground plane pierced by rings around the feed-throughs for the signal planes. Feed-throughs 521 which make connection to the signal planes are isolated from the voltage and ground plane by insulating rings 515. The rings should isolate the voltage or power grids from the feed-throughs by at least 25 μm (1 mil), preferably by at least 50 μm (2 mils), and more preferably by 125 μm (5 mils). Feed-throughs 520 are voltage and ground connections and are not surrounded by an insulating ring.

A dielectric layer 516 is applied over the conductive pattern layer 514 as shown in FIG. 5d. The dielectric may be an organic dielectric such as or an inorganic dielectric such as a silica or thick film dielectric.

Thick film dielectric layers are formed by coating the conductive pattern layer 514 with a dielectric composition and firing to fuse the dielectric layer. The dielectric layer may be applied by any convenient technique, screen printing, roller coating, doctor blade or as a dry, green film. No dielectric vias need be printed or formed before firing the dielectric. Suitable dielectrics may be selected by methods described in copending U.S. patent application Ser. No. 08/171,696, now U.S. Pat. No. 5,378,313. In order to avoid pinholes in the dielectric layer, especially screen printed dielectric layers, preferably two applications and firings are made of the dielectric composition. Additional coatings and firings may be used as long as the overall thickness of the dielectric layer is not so great that the laser energy required to form a via would damage or destroy the underlying conductor. Preferably the dielectric layer will be at least 10 μm (0.4 mils) thick, more preferably 20 μm thick.

Openings 517 in the dielectric, to accommodate vias between layers, are formed by laser ablation through the dielectric layer. The laser energy is controlled to prevent damage or destruction of the underlying conductors. The quantity of laser energy required, which varies with the composition and thickness of the dielectric layer, can be determined empirically. No via artmaster is required. The X-Y coordinates of the vias are fed to the laser controller. The openings can have a diameter between 10–150 μm (0.4–6 mils) depending on the pitch needed for the conductive pattern.

Many commercially available thick film pastes are suitable for forming the dielectric layer. One suitable screen printable dielectric composition is CERMALLOY IP-9117™ from Heraeus Inc., West Conshohocken, Pa. 19428. The fired dielectric layer must be capable of maintaining its shape without reflow after laser ablation or after firing of subsequent layers. The dielectric layer must absorb the laser energy and form clean vias through the layer with minimum damage or penetration of the underlying conductor. Dielectric compositions which do not efficiently absorb the laser beam require high laser energy that either penetrates through the underlying conductor layer, cracks, burns or blisters the dielectric layer around the via, or forms an elevated ridge around the via.

In one alternative procedure, the conductive pattern layer 514 is coated with a polymer such as polyimide or polybenzocyclobutane forming the dielectric layer 516, and the openings 517 are laser ablated, or photoimaged in the polymer before crosslinking the polymer. In another alternative procedure the conductive pattern layer is coated with a silica as the dielectric layer 516. The openings 517 are laser ablated, or the silica dielectric is covered with a mask, and the openings 517 are formed by chemical or plasma etching.

A second, metal layer is applied that covers the dielectric layer 516 and fills the openings. The second, metal layer may also be a either a thick film or thin film metal layer when the dielectric layer is a fired, inorganic layer. The second, metal layer is a sputtered or vacuum deposited metal when the dielectric layer is a polymer or silica dielectric.

A photoresist image of the X-signal plane is applied to the second layer, and a second, conductive pattern layer 518 is formed by etching. The minimum conductor width will be at least 10 µm (0.4 mil). The minimum spacing between conductors will be at least 10 µm. Preferably the minimum conductor line width and spacing will be 60 µm (2.4 mils).

The second, conductive pattern layer is then covered with a second, dielectric layer. Openings are made in the dielectric layer, and a third, metal layer is applied. The third, metal layer makes connections to the X-signal, conductive pattern layer through the openings as shown in FIG. 5e.

Figure 5F:
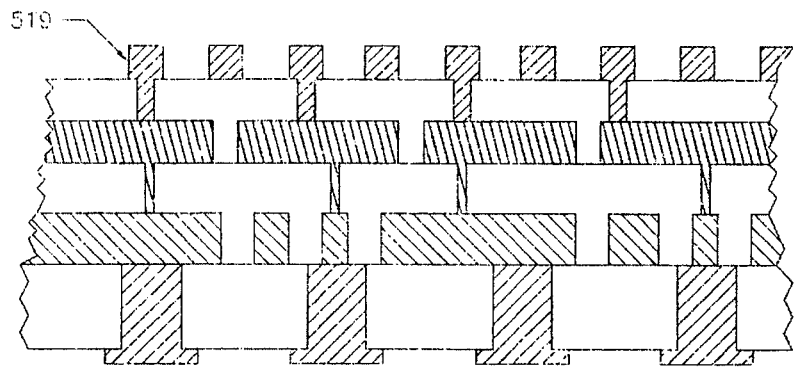

In FIG. 5f a third, conductive pattern layer 519, the Y-signal plane, is shown. The Y-signal, conductive pattern layer is formed from the third conductive metal layer by photolithography.

A third, dielectric layer is applied over Y-signal, conductive pattern layer. Openings to the Y-signal, conductive pattern layer are made through the dielectric layer. The openings have a diameter at least 10 µm (0.4 mils) and less than 150 µm (6 mils), preferably at least 25 µm (1 mil) and preferably less than 75 µm (3 mils). The pitch of the openings matches the pitch of the IOs (input/output pads) of the integrated circuits, and the pattern of the openings makes a mirror image of the IO pad pattern of the integrated circuit. The openings are filled with a pure, soft, ductile metal. The metal should be soft enough to permit simultaneously welding of the protuberances to the input/output pads of the integrated circuit die without requiring welding pressures so high as to damage the die. Soft, ductile gold is deposited by electroplating or electroless plating. The softness of the gold is dictated by the pressure required to thermocompression, thermosonically or ultrasonically bond to the die. If the pressure is too great it may damage the die. Large dice with many input/output pads require softer gold to minimize gang bonding pressure and reduce the stress on the die. A suitable gold is produced by the Aurall 292 Gold Process, available from LeaRonal Inc., Freeport, N.Y. 11520, U.S.A. The Aurall 292 Gold Process uses a electroplating solution containing 8–16 g/l gold at a pH between 6 and 8, and is believed to contain a phosphonate chelating agent.

Figure 5G:
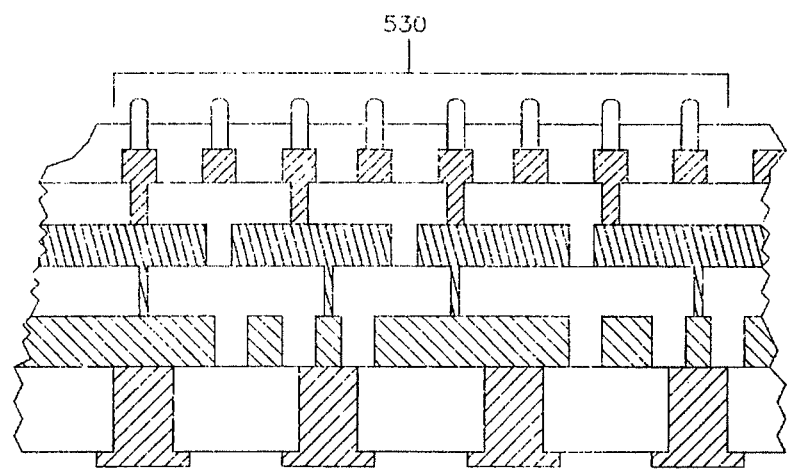

As shown in FIG. 5g the metal is deposited to fill the openings and form hemispherical protuberances 530 over the openings that are 10–80 µm (0.4–3 mils) high.

In order to prevent lateral growth of gold deposits, the plating conditions must be tightly controlled. For example, to obtain uniform gold protuberances using the Aurall 292 Gold Process the pH is maintained at 6.8–7.2, the current density is 0.72 amps/dm$^2$, the solution temperature is 26°–40° C. (preferably 29°–31° C.), and the solution is stirred strongly. If in this plating solution temperature is too high, there is excessive lateral growth; if the temperature is too low, the gold deposit becomes nodular.

In an alternative procedure, the third, dielectric layer is a temporary resist. The openings in the third dielectric layer are made by laser ablation or photoimaging and the temporary resist is stripped after forming the protuberances 530.

Figure 5H:
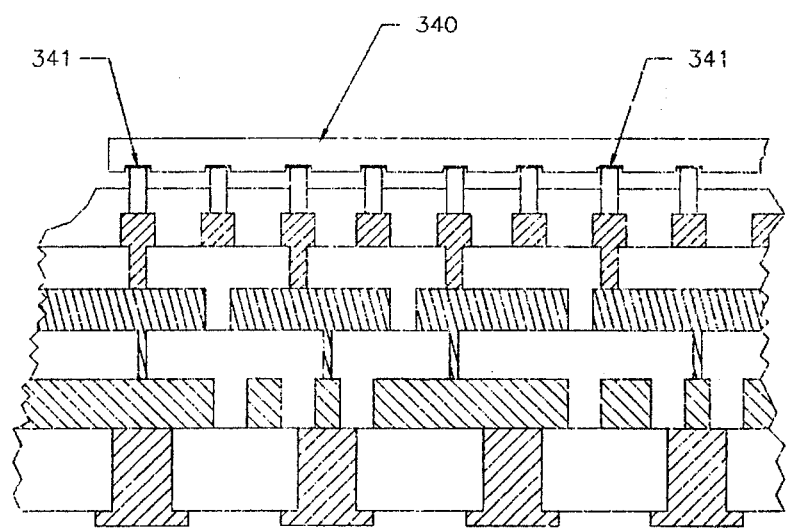

FIG. 5h illustrates an integrated circuit chip 540 having gold or aluminum bonding pads 541 being inverted and placed over the module with the bonding pads in position over the protuberances 530, and the all the chip bonding pads simultaneously thermocompression bonded to the module. C4 integrated circuits with Pb/Sn alloys on the IO pads may also be bonded in a similar manner to the single chip and multichip modules of this invention.

In the final operations (not shown) the module is sealed by applying a frame and a cover or a frame and plug(s) to the module.

In yet another embodiment, the invention comprises a standardized ceramic substrate having cofired refractory metal feed-throughs in a standard area array pattern. A particular conductive pattern may not use all of the feed-throughs. The standard substrate is customized for a particular pattern by isolating the inactive feed-throughs with an insulating layer. The first conductive pattern layer may be formed on the substrate, and the inactive feed-throughs isolated by the first insulating layer. Alternately an substrate and the feed-throughs, and openings laser drilled though the insulating layer exposing the feed-throughs that are required by the customized pattern. The conductive pattern is then applied as described above, the first metallization layer making contact through the openings to the required feed-throughs.

In another embodiment, SCM and MCM packages are provided with "Flat Pack" termination for attachment to the next level package, e.g., a printed circuit board. Flat pack metal contacts maybe positioned on ether the upper or lower surface of the SCM or MCM packages.

When the flat pack metal contacts are positioned on the upper surface of the package, a planar, insulating substrate is provided as the base for the flat pack module. A layer of thin film or thick film metallization is applied to the substrate.

For thick film metallization, a thick film conductor paste may be screen printed on the substrate. The contacts for brazing or soldering of flat pack leads are applied before the thick film metallization layer when refractory metal contacts are used. Platinum/gold or palladium/silver contacts may be applied before or after thick film metallization. The contact pattern is printed around the perimeter of conductive pattern using a paste suitable for brazed or soldered connections such as a refractory metal paste, a palladium/silver or a platinum/gold paste. The thick film metallization is completed by drying and firing the conductor paste on the substrate.

A photoresist is coated over the metal layer. A photoresist image with minimum lines and spaces between 10 µm and 150 µm wide (0.4–6 mils), and corresponding to the conductive pattern of the first layer of a hybrid circuit is printed and developed on the metal layer. The metal not protected by the resist image is etched away. The photoresist is stripped off leaving a metallic conductive pattern. For substrates coated with thin film metallization the etched conductive pattern includes contacts for subsequent brazing or soldering of flat pack leads.

The screen printed contacts slightly overlap selected conductors of the metal conductive pattern.

A thick film dielectric paste is screen printed over the metal conductive pattern. The dielectric paste is printed and fired at least two times to give a dielectric layer approximately 8–12 μm thick.

Laser drilled openings are formed in the dielectric layer. The opening diameters are between 10–150 μm (0.4–6 mils). No via artmaster is required, since the positions of all the openings are computed by the design software which was used to drive the laser.

A second layer of metallic conductive paste is printed and fired over the dielectric layer. The metal fills the openings making contact to the first conductive pattern layer. The second conductive pattern layer is formed from the second metal layer by the photolithographic technique described above.

A second dielectric layer is formed over the second conductive pattern layer by the procedure described above. Laser ablated openings are drilled through the second dielectric layer to the second conductive pattern layer below.

Additional conductive pattern layers may be applied as required. Each conductive pattern layer is covered by a thick film dielectric layer. Openings to the previously applied conductive pattern layer are made through the dielectric layer by laser drilling.

The final conductive pattern layer also is coated with a dielectric layer. Laser ablated openings to the final conductive pattern layer are made in the dielectric layer. The openings have a diameter between 10 μm (0.4 mils) and 150 μm (6 mils), preferably between 25 μm and 75 μm (1 mil and 3 mils). The pitch of the openings matches the pitch of the IOs (input/output pads) of the semiconductor devices. The openings are electroplated or electrolessly plated with a soft, ductile metal that fills the openings and forms protuberances over the openings that are 10–80 μm (0.4–3 mils) high.

Flat pack leads are brazed, soldered, thremocompression bonded or welded onto the contacts.

One or more semiconductor devices having gold or aluminum bonding pads are placed over the module with the bonding pads in position over the metal protuberances and the all the chip bonding pads are simultaneously metallurgically bonded to the module. The conductive pattern and the semiconductor device(s) are sealed by encapsulating in plastic, or by enclosing in a plastic, metal or ceramic enclosure.

Flat pack packages with the flat pack contact mounted on the lower surface of the SCM or MCM offer higher packaging efficiency. A substrate with conductive feed-throughs is used. The conductive pattern is connected to the conductive feed-throughs as shown in FIGS. 1–5. On the other side of the substrate, opposite the conductive pattern, a fan out pattern is provided which fans out from the feed-throughs to the periphery of the substrate. The flat pack contacts are brazed to the fan out pattern on the periphery. With the flat pack contacts underneath the substrate rather than on the top, the dimensions of the package can be reduced by the area required to braze the flat pack connections on a top surface.

The electronic packages and packaging techniques described herein are capable of connecting not only an integrated circuit die with perimeter IO's, but also an integrated circuit die with IO's in an array across the die. Such arrays are commonly used for C4 connections and are proposed for integrated circuits having IO counts too large to be accommodated on the perimeter of the die.

It will be obvious to those skilled in the art that the packages and packaging techniques described herein can be applied not only to a die containing a single integrated circuit, but also to a die containing more than one single integrated circuit. These packages and packaging techniques could even be applied to interconnect all the circuits in a small wafer as a unit without slicing the wafer into dice.

What I claim is:

1. An electronic module for packaging at least one semiconductor device comprising:

a rigid, planar, inorganic, insulating substrate;

the substrate having thereon a metallic, conductive pattern of one or more conductive pattern layers;

the substrate having metal contacts, the contacts being connected to the conductive pattern, and being capable of making electrical connection to another electronic package or a higher level of electronic packaging;

the conductive pattern layer(s) being separated by insulating layer(s);

the conductive pattern layers being interconnected by metal filled vias in the insulating layers;

an outermost, conductive pattern layer having metal protuberances less than 150 μm (6 mils) in diameter protruding 5–80 μm (0.2–3 mils) above the surface of the outermost layer, and the metal protuberances being a soft, ductile metal capable of being metallurgically bonded to input/output pads of the semiconductor device(s), and the metal protuberances being capable of providing input/output connections for the semiconductor devices through the connections to the conductive pattern of the electronic packaging module and through the metal contacts to another electronic package or electronic assembly.

2. An electronic module according to claim 1 wherein the inorganic substrate is selected from the group consisting of silicon, sapphire and ceramics and glass/ceramics comprising aluminum oxide, aluminum nitride, beryllium oxide, boron nitride, cordierite, mullite, silicon carbide and silicon nitride.

3. An electronic module according to claim 2, further comprising an insulating layer coating the outermost, conductive pattern layer, and the protuberances rising 5–80 μm (0.2–3 mils) above the surface of the insulating layer.

4. An electronic module according to claim 3, wherein the insulating layer(s) are thick film dielectric layers.

5. An electronic module according to claim 1, wherein the conductive pattern comprises a plurality of conductive pattern layers.

6. An electronic module according to claim 1, wherein the metal of the metal protuberances is selected from the group comprising aluminum, gold, indium, lead, silver, tin and alloys of these metals.

7. An electronic module according to claim 6, wherein the metal of the metal protuberances is gold.

8. An electronic module according to claim 1, wherein the metal contacts being capable of being connected to the conductive pattern, and being capable of making electrical connection to another electronic package or a higher level of electronic packaging are flat pack contacts.

9. An electronic module according to claim 1, wherein the metal contacts are on the surface of the planar, inorganic substrate opposite to the surface having the conductive pattern, and the substrate is provided with electrically conductive feed-throughs connecting the conductive pattern layers to metal contacts on the opposite surface, and the metal contacts are selected from the group consisting of flat packs and area arrays.

10. An electronic module according to claim 9, wherein the area array is selected from the group consisting of ball grid arrays, column grid arrays, land grid arrays and pin grid arrays.

11. An electronic module according to claim 1, further comprising at least one semiconductor device, the input/output pad areas of the device(s) being bonded to the protuberances, and the protuberances providing direct electrical contact from the semiconductor device(s) to the conductive pattern and the metal contacts of the substrate.

12. An electronic module according to claim 11, wherein the input/output pads of the semiconductor device(s) are on the perimeter of the device(s), and the substrate is provided with electrically conductive feed-throughs from the conductive pattern layers to metal contacts of an area array, the conductive pattern connecting the input/output pads through the feed-throughs to a area array of metal contacts underneath the semiconductor device(s).

13. An electronic module according to claim 11, wherein the module has high packaging efficiency, the module containing a single semiconductor device, the device being sealed in a metal, ceramic or plastic enclosure, and length and breadth of the module is less than 6 mm (150 mils) greater than the length and breath of the device.

14. An electronic module according to claim 13, wherein the length and breath of the module is less than 3 mm (75 mils) greater than the length and breadth of the device.

15. An electronic module according to claim 14, wherein the length and breath of the module is less than 1.6 mm (40 mils) greater than the length and breadth of the device.

16. An electronic module according to claim 11, wherein the module contains a single device, and the length and breadth of the module is less than 0.25 mm (10 mils) greater than the length and breath of the device.

17. An electronic module according to claim 1, wherein the semiconductor devices are a plurality of individual devices contained on one die, and the metal protuberances being capable of providing input/output connections between semiconductor devices on the die through the conductive pattern of the module, and from the semiconductor devices through the conductive pattern of the electronic packaging module and through the metal contacts to another electronic package or electronic assembly.

18. In a circuit module suitable for use as a first level package for at least one semiconductor device, the module having a planar, insulating, ceramic substrate that has a metallic, conductive pattern of one or more conductive pattern layers; the conductive pattern comprising thick or thin film metal layers separated by insulating layer(s); the conductive pattern layers being interconnected by metal filled vias in the insulating layers, and the substrate having metal contacts, the contacts being connected to the conductive pattern, and being capable of making electrical connection to another electronic package or a higher level of electronic packaging, the improvement comprising:

an outermost, conductive pattern layer having metal protuberances less than 150 μm (6 mils) in diameter protruding 5–80 μm (0.2–3 mils) above the surface of the layer, and the metal protuberances being a soft, ductile metal capable of being metallurgically bonded to the input/output pads of a semiconductor device, and the metal protuberances being capable of metallurgically bonding to the input/output pads of a semiconductor device and connecting the input/output pads of the semiconductor device to the conductive pattern of the electronic packaging module and through the metal contacts to another module or the next level electronic package.

19. A circuit module according to claim 18, wherein the metal of the metal protuberances is selected from the group comprising aluminum, gold, indium, lead, silver, tin and alloys of these metals.

20. A circuit module according to claim 19, wherein the metal of the metal protuberances is gold.

21. A circuit module according to claim 19, further comprising an insulating layer coating the outermost, conductive pattern layer, and the protuberances rising 5–80 μm (0.2–3 mils) above the surface of the insulating layer.

22. A circuit module according to claim 19, further comprising at least one semiconductor device, the device having input/output pad areas bonded to the protuberances, the protuberances providing direct electrical contact from the semiconductor device(s) to the conductive pattern and the metal contacts of the substrate.

23. A circuit module according to claim 22, wherein input/output pads of the semiconductor device(s) are on the perimeter of the device(s).

24. A circuit module according to claim 23, further comprising the conductive pattern and the semiconductor device being encapsulated by a plastic composition.

25. A circuit module according to claim 23, further comprising a frame enclosing the conductive pattern and the semiconductor device(s), the frame being bonded to the substrate.

26. An electronic package according to claim 25, further comprising a metal plug, the metal plug being placed against the base of the integrated circuit, the metal plug being metallurgically bonded to the frame, and being capable of conducting heat away from the integrated circuit.

* * * * *